United States Patent

Wray et al.

Patent Number: 5,467,055
Date of Patent: Nov. 14, 1995

[54] POWER AMPLIFIER AND RADIO TRANSMITTER

[75] Inventors: Anthony J. Wray, Hants; Babak Bastani, London, both of United Kingdom; Paul H. Gailus, Prospect Heights, Ill.

[73] Assignee: Motorola, Inc., Schaumburg, Ill.

[21] Appl. No.: 369,243

[22] Filed: Jan. 6, 1995

[30] Foreign Application Priority Data

Jan. 29, 1994 [GB] United Kingdom ............... 9401704

[51] Int. Cl.⁶ ............................................. H03G 3/20
[52] U.S. Cl. ........................................ 330/129; 455/126
[58] Field of Search .......................... 330/51, 107, 129, 330/149, 151; 455/126

[56] References Cited

U.S. PATENT DOCUMENTS 4,238,855 12/1980 Zborowski ...................... 330/149 X
5,066,423 11/1991 Gailos et al. ....................... 330/107
5,423,082  6/1995 Cygan et al. ................... 330/129 X Primary Examiner—Steven Mottola
Attorney, Agent, or Firm—Daniel K. Nichols

[57] ABSTRACT

A power amplifier is described, such as an amplifier employing closed loop feedback (e.g. Cartesian feedback) as well as a radio transmitter incorporating such an amplifier. The amplifier circuit has an amplifier control loop and a loop closing element (18, 107) for selectively opening and closing the control loop in response to a loop closing signal (40). One or more gain elements (30, 31, 32, 33, 101, 102, 110, 111) external to the control loop is adjusted responsive to the loop closing signal so as to maintain approximately constant gain between the input and the output of the amplifier during opening and closing of the loop, Because the gain adjustment is carried out external to the loop, any negative impact on the phase shift or phase stability is reduced or eliminated, and the circuit can be designed with reduced phase margin and greater simplicity.

5 Claims, 1 Drawing Sheet

POWER AMPLIFIER AND RADIO TRANSMITTER

FIELD OF THE INVENTION

This invention relates to a power amplifier, such as an amplifier employing closed loop feedback (e.g. Cartesian feedback) and it relates to a radio transmitter incorporating such an amplifier.

BACKGROUND TO THE INVENTION

Continuing pressure on the limited spectrum available for communication systems is forcing the development of spectrally-efficient linear modulation schemes. Since the envelopes of these linear modulation schemes fluctuate, intermodulation products can be generated in the non-linear power amplifier. Specifically in the private mobile radio (PMR) environment, restrictions on out-of-band emissions are severe (to the order of −60 to −70 dBc) and therefore linear modulation schemes will require highly linear transmitters.

The emphasis in portable PMR equipment is also to increase battery life. Hence, the operating efficiencies of the amplifiers used must be maximised. To achieve both linearity and efficiency, so called linearisation techniques must be employed in the power amplifier (P.A.), improving the linearity of the more efficient amplifier classes e.g. class AB, B or C amplifiers. One such linearising technique often used in designing linear transmitters at present is Cartesian Feedback. This is a "closed loop" negative feedback technique which sums the baseband feedback signal in it's "I" and "Q" formats to the "I" and "Q" input signals prior to amplifying and up-converting this signal to it's output frequency and power level.

A very useful and desirable implementation for trunked radio manufacturers would be for one radio unit to have the ability to operate in both trunked and direct/conventional modes. British patent application Ser. No. 9401703.5 entitled "Power Amplifier for Radio Transmitter and Dual Mode Remote Radio" filed on the same date as British application 9401704.3 (to claims which the present application priority) suggests means for achieving this feature involving switching between closed and open loop modes.

One problem inherent in being able to switch between a negative feedback closed loop mode and an open loop mode is the variation in the resultant power output levels. Switching from closed loop operation to open loop operation causes the transmitter's total power gain to increase by a factor of the closed loop's "loop gain". Consequently the final P.A. device will be driven into saturation by an increase in its drive level of this "loop gain" and will not exhibit the desired 30 dB linearity performance required for it to meet the adjacent channel power levels for direct mode operation. The radio then causes too much interference in adjacent channels.

In certain linearising training schemes it is also necessary to switch between open and closed loop modes. Thus U.S. Pat. No. 5,066,923 of Motorola, Inc. describes a training scheme in which the phase of the amplifier is adjusted in an open loop mode, the loop is closed and the gain of the amplifier is adjusted. In that patent, the need to switch between equal open and closed loop gains is described and a method of achieving this is described in the form of selectively enabling and disabling a gain element in the loop. If a gain element is selectively enabled or disabled within the loop, this can have an impact on the phase shift and phase stability and on the complexity of the circuit.

It would be desirable to integrate a power amplifier and its loop control circuit into a single integrated circuit. Unfortunately, when a circuit of this nature is integrated, it is difficult to provide for adjustment of the gains of elements in the control loop. An improved circuit is needed which is more suited to integration.

SUMMARY OF THE INVENTION

According to the present invention, a power amplifier is provided having an input and an output and comprising, between the input and output: an amplifier circuit comprising a forward loop gain element having an input for receiving a signal to be amplified and an output, a feedback element coupled to the output of the forward gain element for providing a negative feedback signal, a subtractor element for subtracting the negative feedback signal from the signal to be amplified, thereby providing an amplifier control loop and loop closing means for selectively opening and closing the control loop in response to a loop closing signal; and gain adjustment means external to the control loop, responsive to the loop closing signal to select a first external gain when the loop is opened and a second external gain when the loop is closed, said first and second external gains being selected to maintain approximately constant gain between the input and the output of the amplifier during opening and closing of the loop, Because the gain adjustment is carried out external to the loop, any negative impact on the phase shift or phase stability is reduced or eliminated, and the circuit can be designed with reduced phase margin and greater simplicity.

The invention provides the advantage of a simple circuit suitable for discrete manufacture and highly suitable for integration.

The invention is also applicable to future products based on direct conversion transmitters.

Preferred embodiments of the invention are now described, by way of example only, with reference to the drawings.

DETAILED DESCRIPTION OF THE PREFERRED EMBODIMENTS

Figure 1:
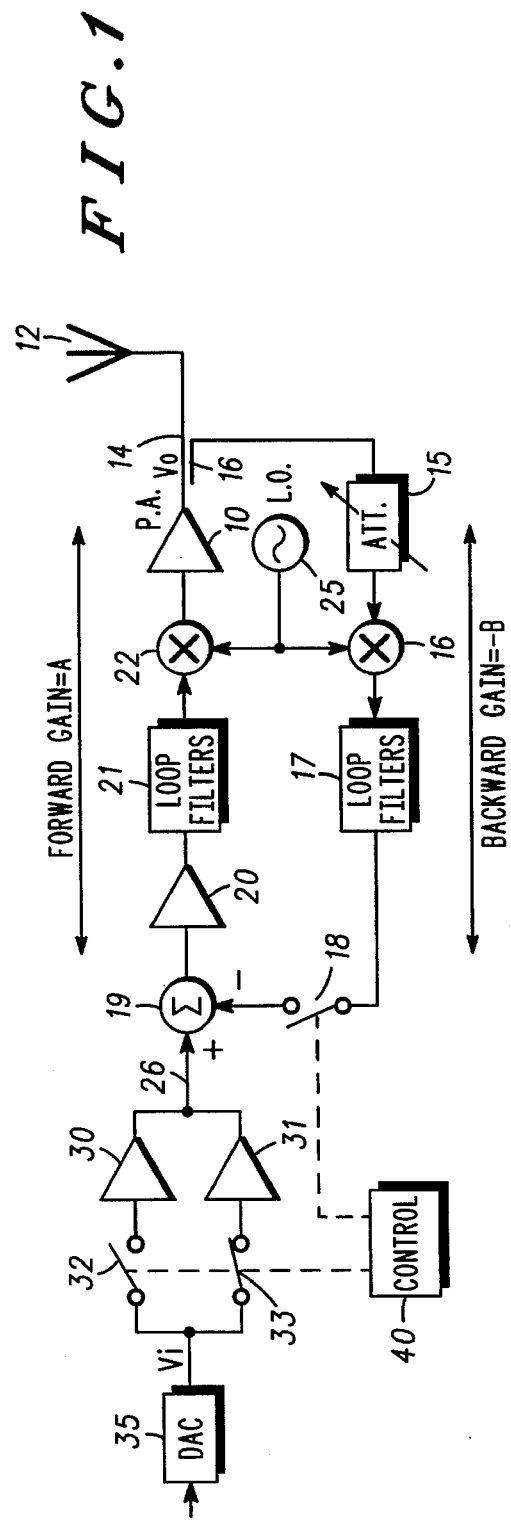
FIG. 1 is a circuit diagram of a first embodiment of the invention.

FIG. 1 Shows a power amplifier employing Cartesian feedback linearisation in accordance with a first preferred embodiment of the invention.

The power amplifier comprises a power amplifier device 10 having an input 11 and an output 12. The output 12 is coupled to an antenna 13 and a feedback coupler 14. The feedback coupler 14 is connected to a variable attenuator 15 connected to a mixer 16 and a loop filter 17. The loop filter 17 is connected via an open/close switch 18 to the negative input of a summing element 19. An output of the summing element 19 is connected via a gain element 20 and a loop filter 21 and converter mixer 22 to the input 11 of the power amplifier. A local oscillator 25 supplies an injection signal to the mixers 22 and 16.

Connected to the positive input 26 of the summing element 19 are first and second parallel connected gain elements 30 and 31, having respective on/off switches 32 and 33. The gain elements 30 and 31 receive a signal input from a digital-to-analog converter (DAC) 35.

Elements 20, 21, 2 and 10 have a combined gain (the "forward gain") equal to A. Elements 15, 16 and 17 have a combined gain "backward gain" which is −B. Gain element 31 has a gain G and gain element 30 has a gain G (1+AB).

Controller 40 controls the switches 18, 32 and 33.

The operation of the circuit is as follows. When the amplifier 10 is to operate in open loop mode, for example for phase training or for direct-mode operation, switch 18 is opened, switch 32 is opened and switch 33 is closed. The combined gain along the forward path between DAC 35 and PA output 12 is G.A. When the amplifier is to operate in closed loop mode (for example for amplifier training or during trunked radio operation), switch 18 is closed, switch 32 is closed and switch 33 is opened. The gain of the loop alone is=A/(1+AB). The overall gain is therefore=GA as before.

In conclusion, approximately the same gain is achieved in opened and closed loop operation.

Figure 2:
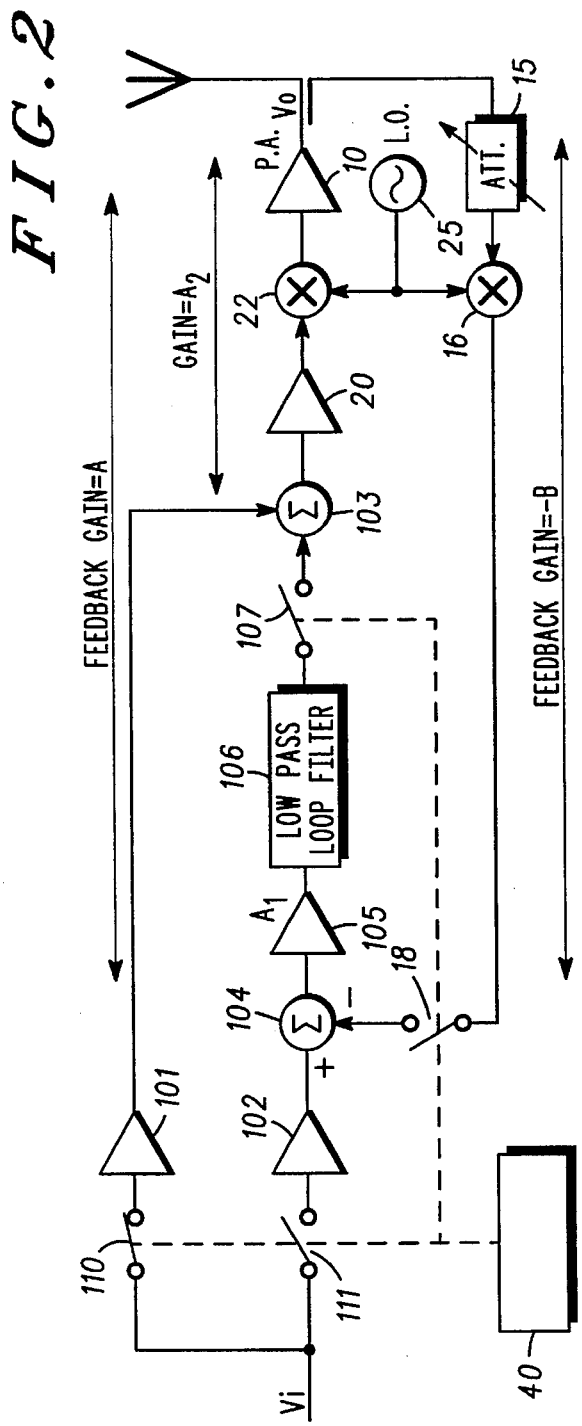
FIG. 2 is a circuit diagram of a second embodiment of the invention.

An example of an alternative circuit which uses "tap-in" gain stages is shown in FIG. 2. Elements 10, 15, 16, 20, 22 and 25 are as described with reference to FIG. 1. In place of a single summing element 19 and in place of gain elements 30 and 31 there are the following elements. Coupled from the input (from the DAC 35) are first and second gain elements 101 and 102. Gain element 101 has gain $G_1$ and is coupled to tap-in summing element 103. Gain element 102 has gain $G_2(1+AB)$ and has its output coupled to a loop summing element 104. Summing element 104 has positive and negative inputs and receives on its negative input the output from down converter mixer 16. Summing element 104 provides its output to error amplifier gain element 105 having gain $A_1$. This gain element provides its output to a low pass filter 106 (which for present calculations is regarded as having negligible loss), which is connected via its switch 107 to summing element 103.

Elements 20, 22 and 10 have an overall gain equal to $A_2$. The selections of the gain elements are such that $G_1 A_2 = G_2 A$ where $A = A_1 + A_2$.

Open loop operation is achieved by opening switches 107 and 111 and closing switch 110 (and opening switch 18). Closed loop operation is achieved by opening switch 110, closing switch 111 and closing switches 107 and 18.

In both modes of operation the total gain is the same. The arrangement of FIG. 2 has advantages over the arrangement of FIG. 1 in that the high gain error amplifier and some of the loop filters are bypassed in open loop mode. This provides better wide-band noise performance, since the signal can be maintained at a higher level throughout the signal path. The arrangement shown in FIG. 2 applies the DAC output signal, by appropriate gain/attenuation in the path for the open loop case to match the output level of the close loop mode.

In summary, two simple solutions are described to solve the problem of gain discrepancies when attempting to operate a radio alternately in two different modes—one that requires a closed loop configuration and one that requires an open loop configuration. To achieve this a two amplifier— two path structure is proposed. One path with the larger gain is used for the closed loop case and the other path with the smaller gain is used for the open loop case. When a radio has been manually switched from one mode of operation to the other, the radio's digital signal processor (not shown) signals a microprocessor (not shown) to transmit an appropriate switching signal to the feedback loop and the baseband gain sections—ensuring that the correct transmitter path and gain is used for the required mode of operation.

The arrangement shown in FIG. 1 can be improved upon by bypassing the high gain error amplifier 105 and some of the loop filters as shown in FIG. 2. This will provide better wide band noise performance as the signal can be maintained at a higher level throughout the signal path.

The invention is applicable for any communications system that requires operation in two modes of operation requiring both a closed-loop and an open-loop circuit implementation. It is particularly targeted towards the Trans-European Digital Trunked Radio ("TETRA") standard where the trunked mode is likely to require a linearising technique such as Cartesian Feedback in a closed-loop mode and the conventional or direct mode may require open-loop operation.

We claim:

1. A power amplifier having an input and an output and comprising, between the input and output:

an amplifier circuit comprising
a forward loop gain element having an input for receiving a signal to be amplified and an output,
a feedback element coupled to the output of the forward gain element for providing a negative feedback signal,
a subtractor element for subtracting the negative feedback signal from the signal to be amplified, thereby providing an amplifier control loop and
loop closing means for selectively opening and closing the control loop in response to a loop closing signal; and a gain adjustment element external to the control loop, responsive to the loop closing signal to select a first external gain when the loop is opened and a second external gain when the loop is closed, said first and second external gains being selected to maintain approximately constant gain between the input and the output of the amplifier during opening and closing of the loop.

2. A power amplifier according to claim 1, wherein the gain adjustment element comprise first and second alternatively selectable parallel connected gain elements.

3. A power amplifier according to claim 1, wherein the gain adjustment element comprise a first gain element for feeding a signal to a first position in the amplifier control loop and a second gain element or feeding the signal to a second, different position in the amplifier control loop.

4. A power amplifier according to claim 3, wherein the first position is an input to the subtractor element and the second position is a position coupled to an output of the subtractor element via a gain element.

5. A radio transmitter comprising a power amplifier having an input and an output and having, between the input and output:

an amplifier circuit comprising
a forward loop gain element having an input for receiving a signal to be amplified and an output,
a feedback element coupled to the output of the forward gain element for providing a negative feedback signal,
a subtractor element for subtracting the negative feedback signal from the signal to be amplified, thereby providing an amplifier control loop and
loop closing means for selectively opening and closing the control loop in response to a loop closing signal; and a gain adjustment element external to the control loop, responsive to the loop closing signal to select a first external gain when the loop is opened and a second external gain when the loop is closed, said first and second external gains being selected to maintain approximately constant gain between the input and the output of the amplifier during opening and closing of the loop, the transmitter also comprising a baseband stage and an upconverter for converting a baseband signal to a radio frequency signal for transmission, wherein the gain adjustment means is located in the baseband stage.

* * * * *